United States Patent
Moribe et al.

[11] Patent Number: 5,954,124
[45] Date of Patent: Sep. 21, 1999

[54] HEAT EXCHANGING DEVICE

[75] Inventors: Makoto Moribe; Yasuo Ueno; Yuka Katagiri, all of Tokyo, Japan

[73] Assignee: NEC Corporation, Tokyo, Japan

[21] Appl. No.: 09/052,312

[22] Filed: Mar. 31, 1998

[30] Foreign Application Priority Data

Mar. 31, 1997 [JP] Japan .................................. 9-096599

[51] Int. Cl.[6] .................................. F24H 3/02; F28D 7/00
[52] U.S. Cl. ........................ 165/104.34; 165/54; 165/121; 165/165; 361/695
[58] Field of Search ..................................... 165/121, 122, 165/104.34, 54, 165, 125; 361/695, 697

[56] References Cited

U.S. PATENT DOCUMENTS

| 4,582,130 | 4/1986 | Modschiedler . |
| 4,997,034 | 3/1991 | Steffen et al. ........................ 165/122 X |
| 5,220,955 | 6/1993 | Stokes ................................. 165/122 X |
| 5,523,918 | 6/1996 | Chiou ....................................... 361/695 |
| 5,661,638 | 8/1997 | Mira ......................................... 361/697 |

FOREIGN PATENT DOCUMENTS

| 2743708 | 4/1979 | Germany ............................. 165/122 |
| 3134521 | 3/1982 | Germany ............................... 165/54 |
| 3-1095 | 1/1991 | Japan . |

*Primary Examiner*—Leonard Leo
*Attorney, Agent, or Firm*—Scully, Scott, Murphy & Presser

[57] ABSTRACT

A heat exchanging device of the present invention includes two fluid compressing means respectively mounted on the centers of both sides of a partition, each for feeding a respective fluid under pressure. A plurality of passageways adjoin each other around the fluid compressing means, and each faces the associated fluid compressing means at one end while facing the outside of the partition at the other end. The passageways protrude from both sides of the partition. Among the passageways, either the odd passageways or the even passageways are open on the front side of the partition at both ends while the other passageways are open on the rear side of said same at both ends. Two fluids of different temperatures respectively compressed by the fluid compressing means are respectively fed under pressure from one ends to the other ends of the odd passageways and the even passageways while contacting each other with the intermediary of the side walls of the passageways to thereby exchange heat.

3 Claims, 6 Drawing Sheets

HEAT EXCHANGING DEVICE

BACKGROUND OF THE INVENTION

The present invention relates to a heat exchanging device for effecting heat exchange between two fluids of different temperatures.

The prerequisite with an electronic apparatus of the kind consuming great power is that heat generated in the apparatus be radiated to the outside in order to prevent inside temperature from rising. The elevation of temperature inside the apparatus would render the operation of the individual device constituting circuitry unstable and would result in the malfunction and failure of the apparatus. To meet such a requirement, a cooling fan has customarily been mounted on the apparatus in order to introduce cool air from the outside while discharging hot air from the inside, i.e., to replace inside air and outside air.

However, the problem with the cooling fan is that dust is introduced into the apparatus together with outside air. Particularly, dust containing, e.g., conductive metal powder is apt to bring about a critical trouble in the apparatus. In light of this, a filter is also mounted on the apparatus in order to filter out dust. This, however, brings about another problem that the filter must be replaced and cleaned periodically; otherwise, dust would stop up the filter and would thereby lower the efficiency of the fan. Replacing and cleaning the filter periodically is problematic from the function and management standpoint. Moreover, when the apparatus is adapted for an outdoor application, rain and water are likely to enter the apparatus. Therefore, the apparatus cannot be situated outdoor alone.

Japanese Patent Laid-Open Publication No. 3-1095, for example, discloses a heat exchanging device capable of effecting heat exchange without replacing fluids. This kind of heat exchanging device, however, has a problem that passageways for fluids are too narrow and complicated to implement a high flow rate, failing to guarantee a sufficient amount of heat exchange for a unit time.

SUMMARY OF THE INVENTION

It is therefore an object of the present invention to provide a miniature heat exchanging device capable of effecting efficient heat exchange without replacing two fluids of different temperatures, capable of effecting heat exchange alone, and usable in any desired environment.

A heat exchanging device for effecting heat exchange between two fluids different in temperature and isolated from each other by a partition of the present invention includes two fluid compressing means respectively mounted on the centers of both sides of a partition, each for feeding a respective fluid under pressure. A plurality of passageways adjoin each other around the fluid compressing means, and each faces the associated fluid compressing means at one end while facing the outside of the partition at the other end. The passageways protrude from both sides of the partition. Among the passageways, either the odd passageways or the even passageways are open on the front side of the partition at both ends while the other passageways are open on the rear side of said same at both ends. Two fluids of different temperatures respectively compressed by the fluid compressing means are respectively fed under pressure from one ends to the other ends of the odd passageways and the even passageways while contacting each other with the intermediary of the side walls of the passageways to thereby exchange heat.

The fluid compressing means should preferably be implemented by centrifugal fans.

It is desirable that the fluid compressing means be driven by a single motor mounted on one of the both sides of the partition.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENT

Figure 1A:
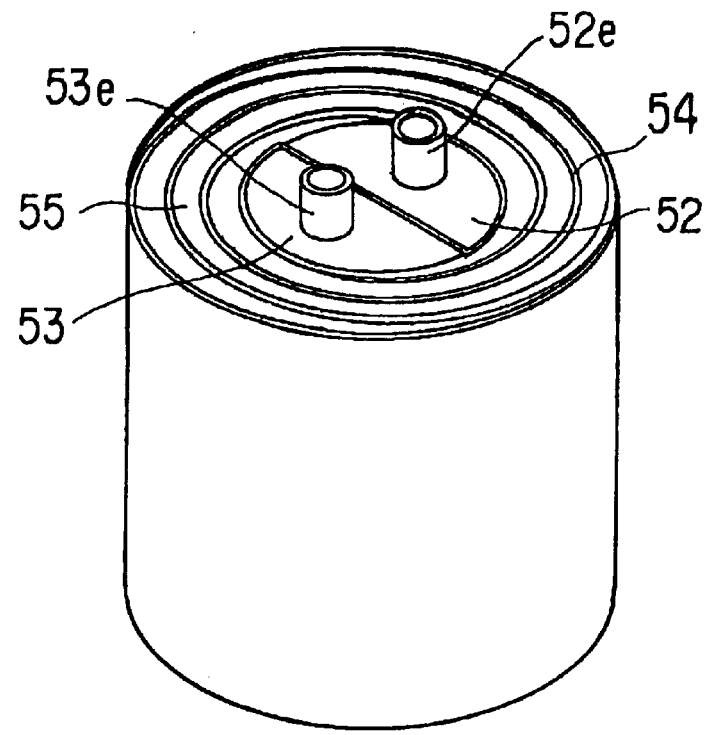
FIGS. 1A and 1B are respectively a perspective view and a vertical section showing a conventional heat exchanging device.
Figure 1B:
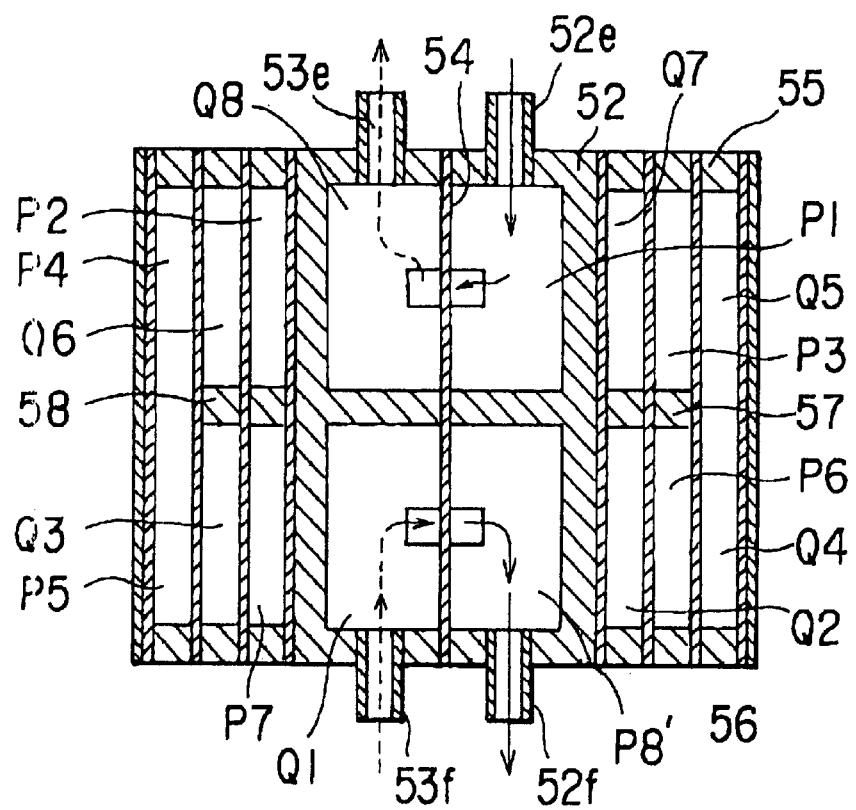

To better understand the present invention, brief reference will be made to a conventional heat exchanging device, shown in FIGS. 1A and 1B. The heat exchanging device to be described is taught in Laid-Open Publication No. 3-1095 mentioned earlier. As shown, the device includes divided center cores 52 and 53 forming a hollow cylinder in combination. A partition 54 is spirally wound radially outward from the innermost portions of the center cores 52 and 53. End spacers 55 and 56 respectively close the opposite ends of the partition 56. Intermediate spacers 57 and 58 each divides a passageway formed by the partition 54. A fluid flows into the center core 52 via a first pipe 52e formed in the core 52. This fluid flows radially outward along an upper spiral passageway formed by the partition 54 (P1–P4). On reaching the outermost wall, the fluid flows radially inward along a lower spiral passageway toward the center core 52 (P6–P8). The fluid reached the center core 52 flows out of the core 52 via a second pipe 52f also formed in the core 52. Another fluid flows into the center core 53 via a first pipe 53f formed in the core 53, flows radially outward along a lower passageway formed by the partition 4 (Q1–Q4), flows radially inward along an upper passageway via the outermost wall (Q5–Q8), and then flows out of the core 53 via a second pipe 53e also formed in the core 53. In this configuration, the two fluids exchange heat via the partition 54. The conventional device, however, must feed each of the two fluids by use of respective feeding means and is therefore large size. Such a large size device is not applicable to small size electronic apparatuses.

Figure 2:
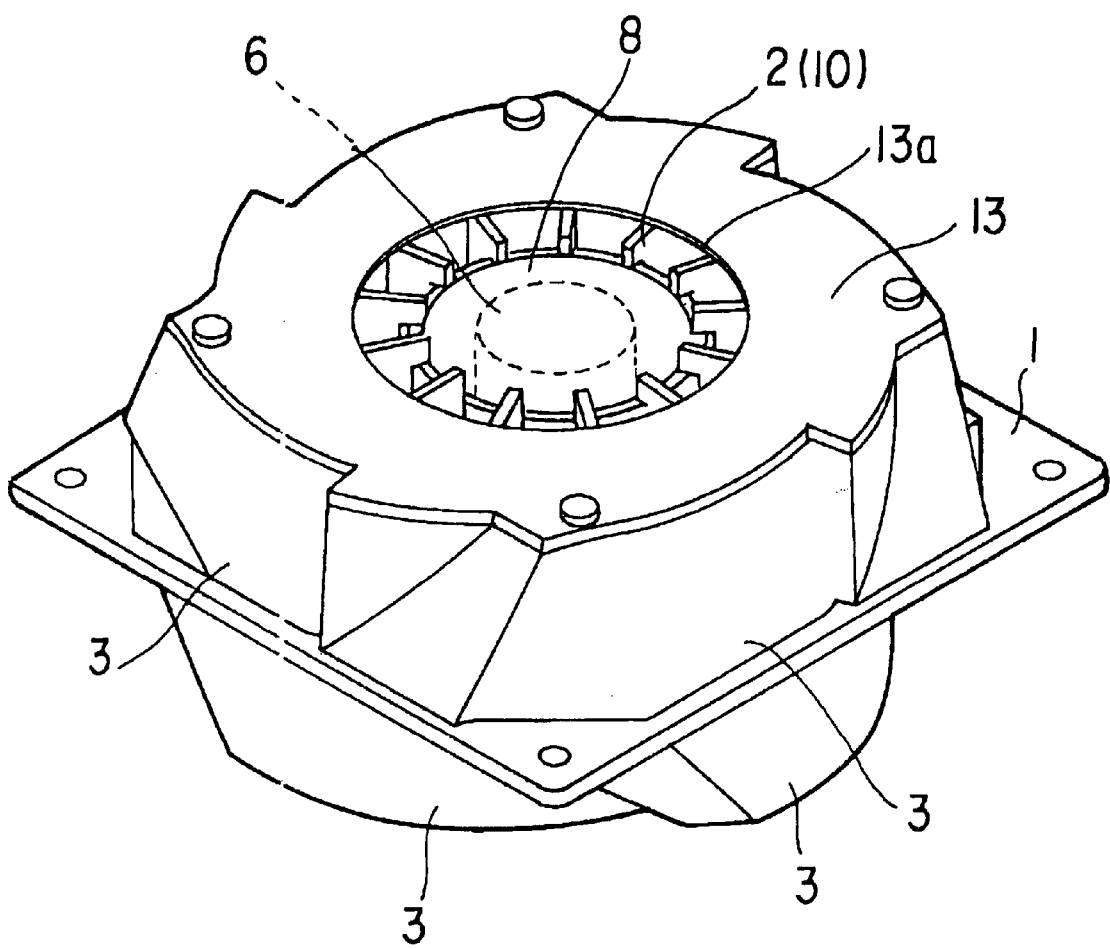
FIG. 2 is a perspective view showing a heat exchanging device embodying the present invention.
Figure 3:
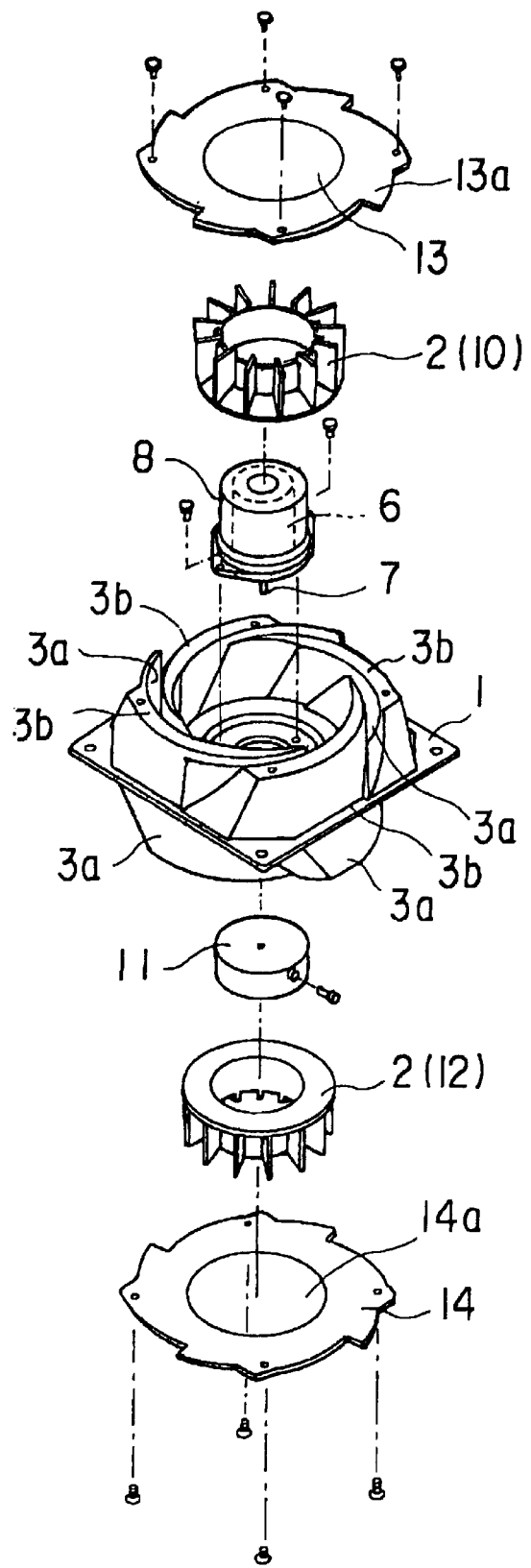
FIG. 3 is an exploded perspective view of the illustrative embodiment.

Referring to FIGS. 2 and 3, a heat exchanging device embodying the present invention will be described. As shown, the heat exchanging device includes a partition 1 for isolating two fluids from each other. Two fluid compressing means 2 each is positioned at the center of the respective side of the partition 1. A plurality of passageways 3 surround the fluid compressing means 2, and each adjoins the fluid compressing means 2 at one end and faces the outside of the partition 1 at the other end.

A motor 6 is affixed to the center of the front or upper surface of the partition 1, as viewed in FIGS. 2 and 3. A first centrifugal fan 10, which is one of the two fluid compressing means 2, is mounted on one end the output shaft 7 of the motor 6 via an adapter 8. The other end of the shaft 7 extends throughout the partition 1 to the rear or lower surface, as viewed in FIGS. 2 and 3. A second centrifugal fan 12, which is the other fluid compressing means 2, is mounted on the rear or lower end of the shaft 7 via a fan bush 11. The centrifugal fans 10 and 12 each is driven by the motor 6 in order to compress and feed a respective fluid to the associated passageways 3, as will be described specifically later.

If desired, a groove, not shown, may be formed in at least one of opposite sides of the partition 1 around the passageways 3 in order to fit an O-ring for a shielding purposed.

Figure 4:
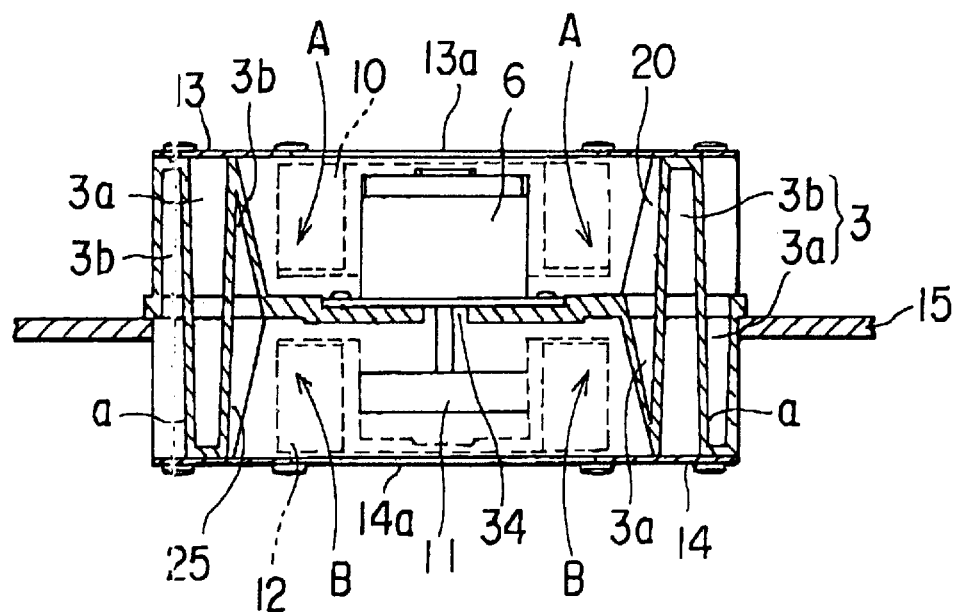
FIG. 4 is a fragmentary vertical section of the illustrative embodiment.
Figure 5:
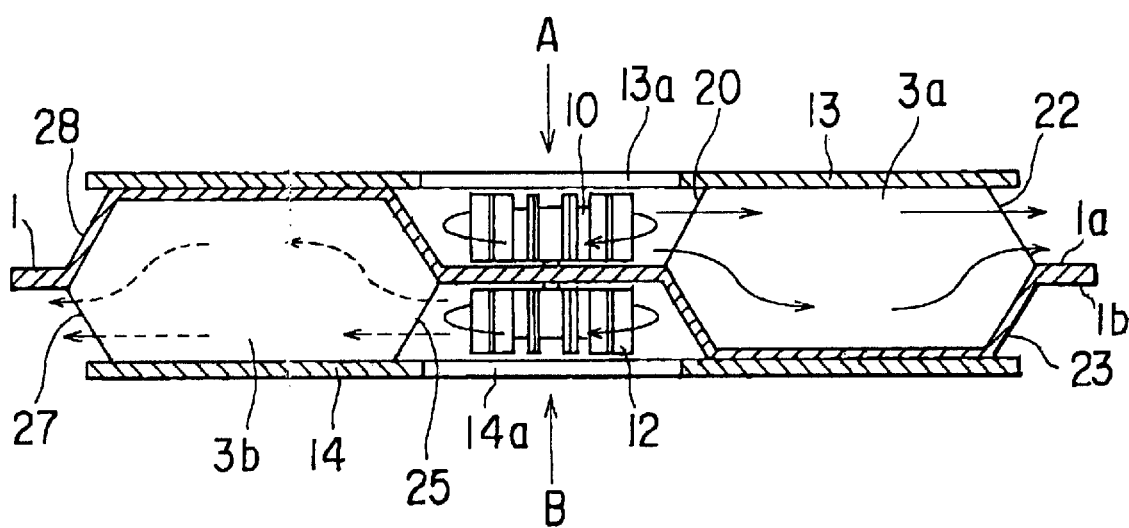
FIG. 5 is a fragmentary vertical section showing passageways included in the illustrative embodiment in a developed view.

The passageways 3 are formed of the same material as the partition 1 and protrude from the front and rear of the partition 1. The passageways 3 are generally arranged in the form of a spiral, i.e., they adjoin each other while being bent in an arcuate configuration. As shown in FIGS. 4 and 5, disk-like shield plates 13 and 14 formed of the same material as the partition 1 are respectively affixed to the upper and lower surfaces of the partition 1. Center openings 13a and 14a are formed in the shield plates 13 and 14, respectively. Among the passageways 3, the odd passageways, labeled 3a, are top-open and closed by the upper shield plate 13 such that both ends of the passageways 3a are open on the front 1a of the partition 1. In this configuration, a fluid is capable of flowing from one to the other end of each passageway 3a without spreading or flowing reversely. The even passageways, labeled 3b, are bottom open and closed by the lower shield plate 14 such that both ends of the passageways 3b are open on the rear 1b of the partition 1. This allows a fluid to flow from one end to the other end of each passageway 3b without spreading or flowing reversely. The fluid flowing through the passageways 3a and the fluid flowing through the passageways 3b are separated from each other by the common walls a of the passageways 3a and 3b.

Figure 6A:
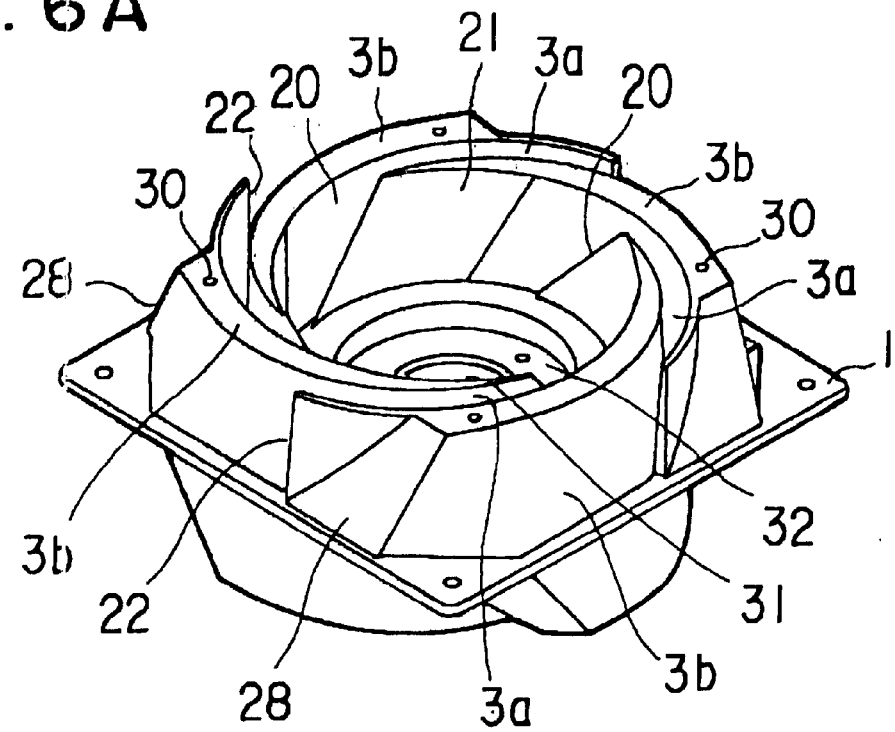
FIGS. 6A and 6B are respectively a top perspective view and a bottom perspective view showing the configuration of the passageways.
Figure 6B:
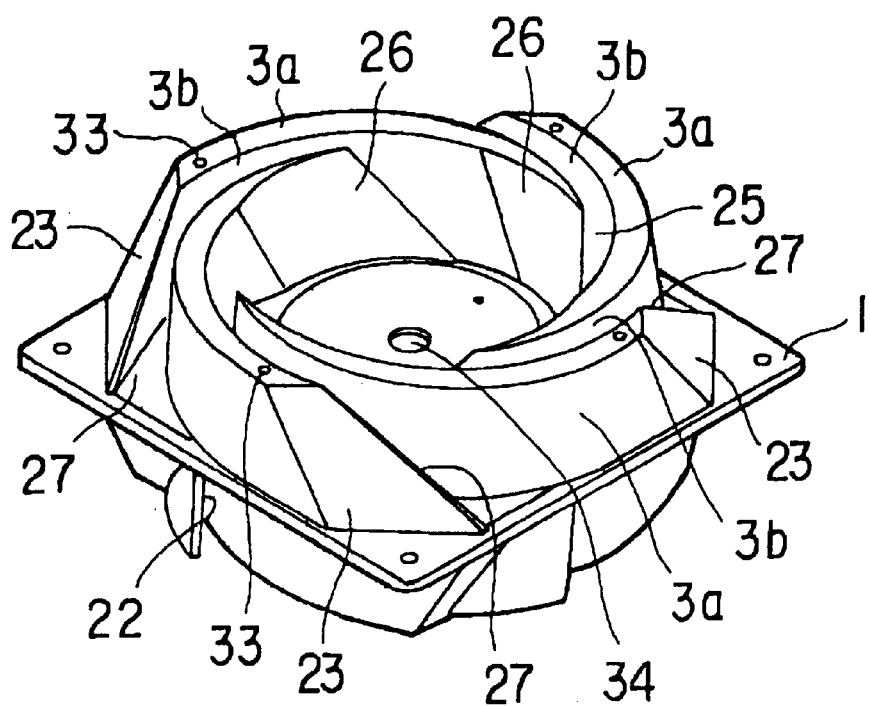

As shown in FIG. 6A, the walls forming the passageways 3b each is formed with a slant 21 and tapered thereby in the direction in which the fluid enters the inlet 20 of the adjoining passageway 3a. Also, as shown in FIG. 6B, the above walls each is formed with a slant 23 in the direction in which the fluid leaves the outlet 22 of the adjoining passageway 3a. The slants 21 and 23 reduce resistance to the flow of the fluid and noise. There are also shown in FIG. 6A screw holes 30 for fastening the shield plate 13, a recess 31 for mounting the motor 6, and screw holes 32 for fastening the motor 6. As shown in FIG. 6B, the walls forming the passageways 3a each is formed with a slant 26 and tapered thereby in the direction in which the fluid enters the inlet 25 of the adjoining passageway 3b. Also, as shown in FIG. 6B, the above walls each is formed with a slant 28 in the direction in which the fluid leaves the outlet 27 of the adjoining passageway 3b. The slants 26 and 28, like the slants 21 and 23, reduce resistance to the flow of the fluid and noise. There are also shown in FIG. 6B screw holes 33 for fastening the shield plate 14, and a through hole 34 for receiving the output shaft 7 of the motor 6.

Figure 7:
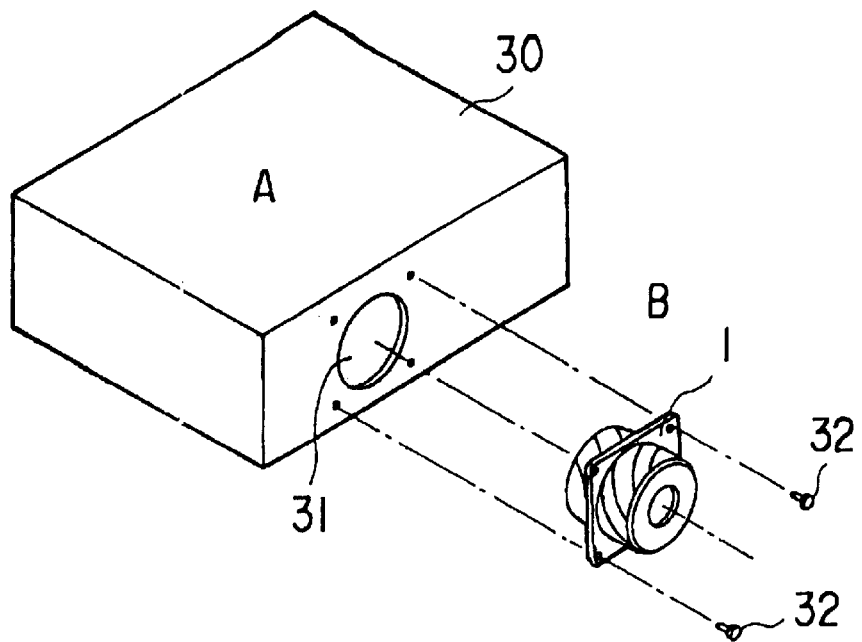
FIG. 7 is a perspective view showing a specific application of the illustrative embodiment.

As shown in FIG. 7, the above heat exchanging device is inserted into the casing 30 of a desired apparatus via an opening 31 such that its side where the motor 6 is positioned is received in the casing 30. Then, the device is fastened to the casing 30 by screws 32. In this condition, the partition 1 fully isolates a fluid (inside air) A inside of the casing 30 and a fluid (outside air) B outside of the casing 30. As shown in FIG. 5, the fluid A sucked via the opening 13a of the shield plate 13 by the centrifugal fan 10 is fed under pressure to the passageways 3a via the inlets 20. Likewise, the fluid B sucked via the opening 14a of the shield plate 13 by the fan 12 is fed under pressure to the passageways 3b via the inlets 25.

The fluid A entered the device via each inlet 20 flows toward the outlet 22 along the odd passageway 3a whose open top is closed by the shield plate 13, as indicated by solid arrows in FIG. 5. This is also true with the fluid A entering the other inlets 20. On the other hand, the fluid B entered the device via each inlet 25 flows toward the outlet 27 along the even passageway 3b, as indicated by phantom arrows in FIG. 5. This is also true with the fluid B entering the other inlets 25.

Figure 8:
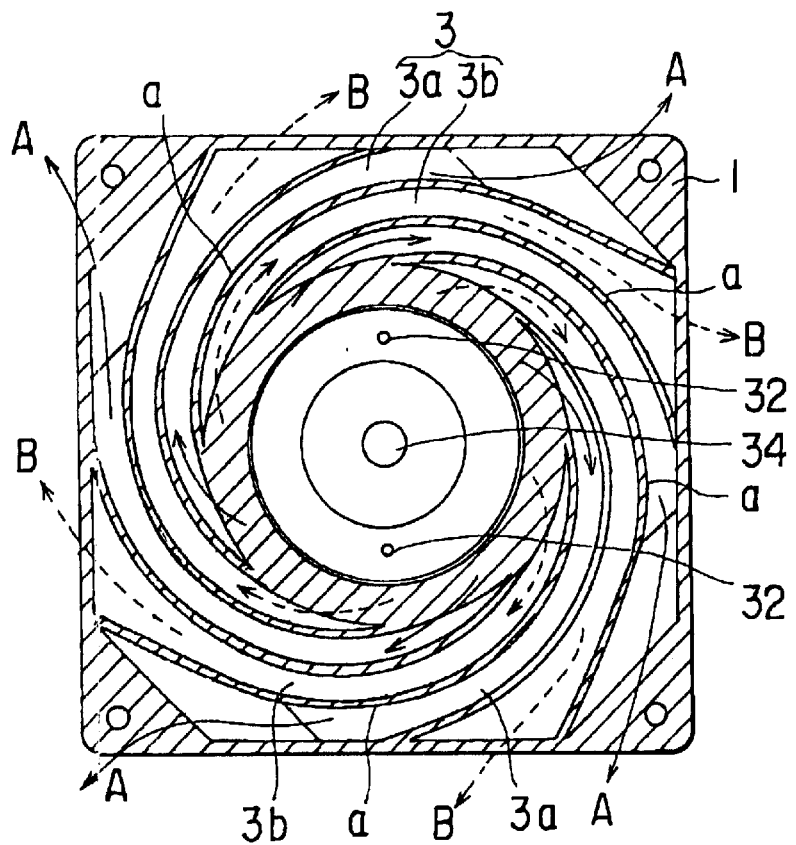
FIG. 8 is a fragmentary horizontal section of the illustrative embodiment.

The odd passageways 3a and even passageways 3b alternate with each other. Therefore, as shown in FIG. 8, the fluid A flows along the passageways 3a in the direction indicated by solid arrows while the fluid B flows along the passageways 3b in the direction indicated by phantom arrows. At this instant, the heat of the fluid A flowing through the odd passageways 3a is transferred to the inner walls of the passageways 3a, but the heat of the fluid B flowing through the even passageways 3b is transferred to the inner walls of the passageways 3b. However, because the outer walls of the passageways 3a and those of the passageways 3b respectively constitute the inner walls of the passageways 3b and those of the passageways 3a at the same time, the fluids A and B different in temperature contact each other with the intermediary of a single wall a. As a result, the fluids A and B exchange heat with each other via the walls a while flowing through the passages 3a and 3b, respectively.

The center portions of the passageways 3a and 3b respectively protrude to the opposite sides of the partition 1, successfully increasing the heat transfer area of each side wall a. Further, because the centrifugal fans 10 and 12 are efficient as to pressure loss, and because the inlets and outlets are so configured as to reduce resistance to the flow of the fluids A and B, a sufficient flow rate is guaranteed. This, coupled with the broad heat transfer area of the side walls a, increases the amount of heat exchange and thereby promotes efficient heat exchange.

The heat exchange occurs via the thin side walls over a broad area defined by the individual passageway. It follows that even plastics inherently low in thermal conductivity are usable because their thermal resistance is low.

By contrast, when the fluid compressing means 2 are replaced with a propeller type or axial-flow fan, a fluid flowing along the passageways 3 would lose its velocity due to a high pressure and would thereby reduce the compression efficiency and therefore the amount of heat exchange.

When the heat exchanging device is mounted to, e.g., an electronic apparatus, heated air inside the apparatus is caused to flow into the odd passageways 3a by the centrifugal fan 10. This air flows out via the outlets 22 while transferring its heat to the inner walls of the passageways 3 while the outside air cools the inner walls of the passageways 3b. However, because the outer walls of the passageways 3a and those of the passageways 3b respectively constitute the inner walls of the passageways 3b and those of the passageways 3a at the same time, the fluids different in temperature contact each other with the intermediary of a single wall. As a result, the fluids exchange heat with each other and thereby lower the temperature in the apparatus.

The electronic apparatus with the above heat exchanging device can have its interior cooled without inside and outside air being replaced. This prevents dust and moisture contained in the outside air from entering the apparatus. Therefore, the apparatus can be operated at an undesirable location, e.g., outdoor or at a dusty place.

The single motor 6 mounted on the front of the partition 1 drives the two centrifugal fans 10 and 12 mounted on both sides of the partition 1, so that heat exchange can be effected without replacing two different fluids. Therefore, when the heat exchanging device is mounted to an apparatus, it should only be so oriented as not to put the motor 6 in an undesirable environment, i.e., it is not necessary to take account of the directions of the fluids.

Because the illustrative embodiment implements efficient heat exchange, plastics low in thermal conductivity may be used in order to enhance productivity, as stated earlier. Alternatively, the heat exchanging device may be partly (shield plates) or entirely formed of aluminum, copper or similar metal having high thermal conductivity.

While the foregoing description has concentrated on two different gases (air), they may be replaced with a liquid and a gas or with two liquids, if necessary. In such a case, the motor 6 will be implemented by a water-proof motor. The illustrative embodiment includes four odd passageways and four even passageways, i.e., eight passageways in total. However, any other desired number of passageways other than eight may be formed so long as it is even.

In summary, in accordance with the present invention includes two different groups of passageways alternately contacting a partition, which separates two fluids, and each assigned to the respective fluid. The device is therefore capable of effecting efficient heat exchange via the side walls of the passageways without resorting to the replacement of the fluids. When the device is applied to a desired apparatus, the apparatus is operable stably over a long period of time without dust or water entering it. The device additionally includes fluid compressing means despite its compact configuration and can be easily mounted to a desired apparatus.

Because the two fluids contacting each other with the intermediary of thin side walls promote efficient heat exchange, even plastics inherently low in thermal conductivity are usable in order to enhance productivity and reduce production cost to a noticeably degree.

The device of the invention is maintenance-free and therefore desirable from the operation and management standpoint because it does not need a filter or the like for intercepting dust. In addition, the device is usable in any desired environment because its interior is fully isolated from the outside.

What is claimed is:

1. A heat exchanging device for effecting heat exchange between two fluids of different temperatures isolated from each other by a partition, said heat exchanging device comprising:

fluid compressing means respectively mounted on centers of both sides of said partition, each for feeding a respective fluid under pressure;

a plurality of passageways adjoining each other around said fluid compressing means and each facing an associated one of said fluid compressing means at one end and facing an outside of said partition at the other end, said plurality of passageways having side walls, said plurality of passageways protruding from the both sides of said partition, a first set of said plurality of passageways being open on a front side of said partition at both ends while a second set of said plurality of passageways being open on a rear side of said partition at both ends, wherein the two fluids of different temperatures respectively compressed by said fluid compressing means are respectively fed under pressure from the one end to the other end of said first and second set of passageways while contacting each other with an intermediary side wall of said passageways to thereby exchange heat.

2. A heat exchanging device as claimed in claim 1, wherein said fluid compressing means comprise centrifugal fans.

3. A heat exchanging device as claimed in claim 3, wherein said fluid compressing means are driven by a single motor mounted on one of the both sides of said partition.

\* \* \* \* \*